(12) United States Patent
Obatake

(10) Patent No.: US 8,853,987 B2
(45) Date of Patent: Oct. 7, 2014

(54) ELECTRIC TOOL

(75) Inventor: Takayoshi Obatake, Nishinomiya (JP)

(73) Assignee: Maeda Metal Industries, Ltd., Osaka-Shi, Osaka (JP)

( * ) Notice: Subject to any disclaimer, the term of this patent is extended or adjusted under 35 U.S.C. 154(b) by 187 days.

(21) Appl. No.: 13/578,390

(22) PCT Filed: Feb. 9, 2011

(86) PCT No.: PCT/JP2011/052717
§ 371 (c)(1),
(2), (4) Date: Aug. 10, 2012

(87) PCT Pub. No.: WO2011/099506
PCT Pub. Date: Aug. 18, 2011

(65) Prior Publication Data
US 2012/0306425 A1  Dec. 6, 2012

(30) Foreign Application Priority Data

Feb. 10, 2010 (JP) ................. 2010-027094

(51) Int. Cl.
*G01R 31/02* (2006.01)
*B25F 5/00* (2006.01)
*H03K 17/16* (2006.01)
*H03K 17/968* (2006.01)

(52) U.S. Cl.
CPC ............... *B25F 5/00* (2013.01); *H03K 17/163* (2013.01); *H03K 17/968* (2013.01); *H03K 2217/0009* (2013.01)
USPC ........................... 318/490; 318/503; 318/802

(58) Field of Classification Search
USPC .......... 318/490, 503, 802, 434, 432, 433, 345
See application file for complete search history.

(56) References Cited

U.S. PATENT DOCUMENTS

| 2007/0205665 | A1 | 9/2007 | Kawano et al. |
| 2009/0015183 | A1 | 1/2009 | Watanabe |
| 2009/0195205 | A1* | 8/2009 | Ide .................................. 318/490 |

FOREIGN PATENT DOCUMENTS

| JP | 8-154392 A | 6/1996 |
| JP | 9-219987 A | 8/1997 |

(Continued)

OTHER PUBLICATIONS

International Preliminary Report on Patentability for PCT/JP2011/052717, mailed Sep. 27, 2012.

*Primary Examiner* — Karen Masih
(74) *Attorney, Agent, or Firm* — K&L Gates LLP

(57) ABSTRACT

In an electric tool, in order to carry out a phase control or an antiphase control using a transistor, constant voltage generating means of the tool includes a series circuit including a resistor and a diode, and a parallel circuit including a capacitor and a Zener diode. One end of the resistor is connected between an AC power supply and an AC motor. A cathode of the diode is connected to one capacitor end and a cathode of the Zener diode. The other capacitor end and an anode of the Zener diode are connected to transistor sources. One ends of resistors are connected to gates of the transistors, and a voltage at the other ends of the resistors are switched between a voltage at a node between the series circuit and the parallel circuit and a voltage of the source of the transistors to turn the transistors ON or OFF.

4 Claims, 1 Drawing Sheet

(56) References Cited

FOREIGN PATENT DOCUMENTS

| JP | 11-161346 A | 6/1999 |
|----|----|----|
| JP | 2003-52195 A | 2/2003 |
| JP | 2005-73350 A | 3/2005 |
| JP | 2006-937 A | 1/2006 |
| JP | 2006-297574 A | 11/2006 |
| JP | 2007-229891 A | 9/2007 |
| JP | 2009-12149 A | 1/2009 |

* cited by examiner

F I G. 1
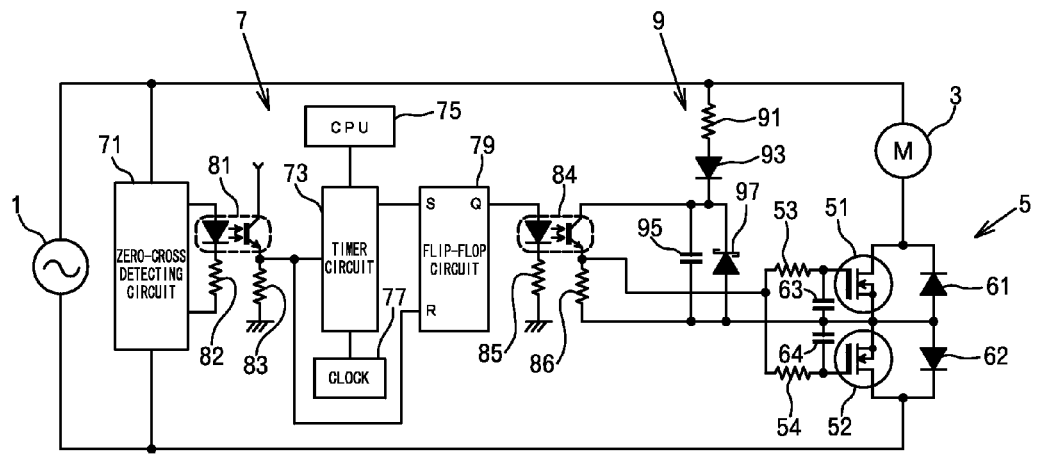
F I G. 2
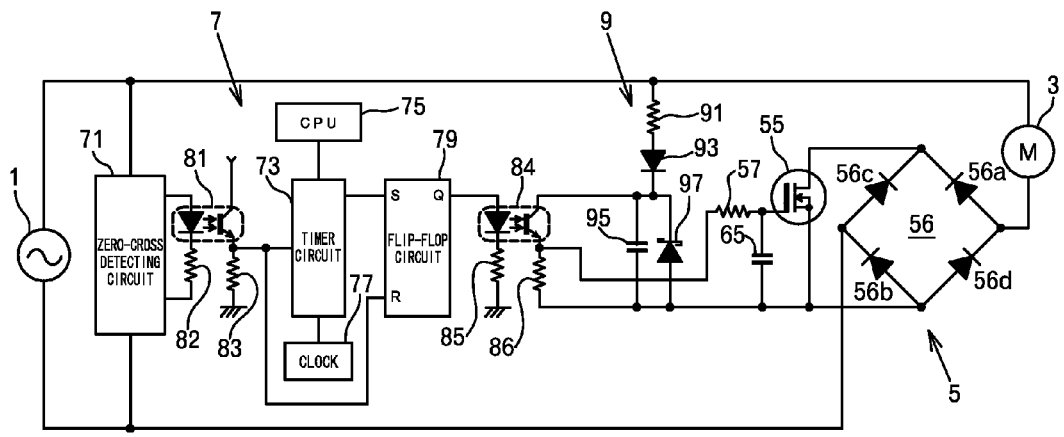

ELECTRIC TOOL

CROSS REFERENCE TO RELATED APPLICATION

This application is a National Stage Application of PCT/JP2011/052717, filed Feb. 9, 2011, which claims the benefit of Ser. No. JP 2010-027094, filed Feb. 10, 2010 in Japan and which applications are incorporated herein by above disclosed applications.

TECHNICAL FIELD

The present invention relates to an electric tool such as a bolt tightening machine using an AC motor and more particularly to an electric tool for carrying out a phase control or an antiphase control of an AC motor by using a transistor as a switching element.

BACKGROUND ART

In an electric tool such as a bolt tightening machine using an AC motor, a phase control or an antiphase control is carried out over the AC motor so that a tightening torque for a bolt or the like is controlled. In an electric apparatus for carrying out the phase control or the antiphase control, an electromagnetic noise is caused by a rapid change in current in switching. In an electric tool using an AC motor in which a commercial AC power supply is utilized as a power supply, a large current flows through the AC motor. Consequently, there is increased an electromagnetic noise caused by a change in current in switching. For this reason, there is a particular fear that a peripheral electric apparatus or a human body might be adversely influenced.

For example, Japanese Patent Laid-Open Publication No. 2009-12149 and Japanese Patent Laid-Open Publication No. 08-154392 disclose an electric tool for carrying out a phase control of an AC motor using a commercial AC power supply as a power supply by utilizing a triac or an SSR as a switching element. By providing a snubber circuit in the electric tool, it is possible to reduce an electromagnetic noise caused by a change in current. However, there is a problem in that a space for providing the snubber circuit is to be ensured or a cost is increased. By decreasing the current flowing through the AC motor, moreover, it is possible to reduce the electromagnetic noise caused by the change in current. However, a power of the AC motor is reduced. For this reason, the decrease in the current is not preferable in respect of a performance of the electric tool.

In recent years, in the field of power electronics, a transistor capable of controlling a large current is widely used, such as an MOSFET or an IGBT. It is supposed that an electromagnetic noise generated by an electric tool for carrying out a phase control or an antiphase control can be suppressed by using the transistor in place of the triac or the SSR because the use of the transistor is advantageous for a reduction in the change in current in switching. For example, Japanese Patent Laid-Open Publication No. 11-161346 discloses a phase control device for carrying out a phase control or an antiphase control by using two MOSFETs connected in series in opposite directions. It can be proposed that the structure of the phase control device is employed for the electric tool using the AC motor, thereby carrying out the phase control or the antiphase control.

PRIOR ART DOCUMENT

Patent Document

Patent Document 1: Japanese Patent Laid-Open Publication No. 2009-12149
Patent Document 2: Japanese Patent Laid-Open Publication No. 08-154392
Patent Document 3: Japanese Patent Laid-Open Publication No. 11-161346

SUMMARY OF THE INVENTION

Problems to be Solved by the Invention

In an electric tool having an AC motor to which a power is supplied from a commercial AC power supply, in the case where a phase control or an antiphase control using a transistor is carried out, a transistor capable of controlling a large current is utilized. For this reason, it is necessary to generate a comparatively high constant voltage from an AC voltage, thereby inputting the generated voltage to a control terminal of the transistor, that is, a gate or a base. Referring to the phase control device shown in FIG. 2 of the Japanese Patent Laid-Open Publication No. 11-161346, a gate power supply portion using a transformer is utilized to obtain a gate driving voltage from an AC voltage. However, the gate power supply portion is not preferable in respect of a space, an increase in a cost, an increase in a weight or the like.

Referring to the phase control device shown in FIG. 8 of the Japanese Patent Laid-Open Publication No. 11-161346, moreover, a series circuit of an AC power supply and a load is connected between input terminals of a diode bridge. Even if the AC voltage to be applied between these terminals is subjected to the full-wave rectification through the diode bridge, a high DC voltage cannot be obtained stably. For this reason, the structure is not preferable for a phase control or an antiphase control using a transistor capable of controlling a large current.

The present invention solves the above problems and has an object to implement a phase control or an antiphase control using a transistor with the cost lower, space saved, weight lighter and structure simpler, and to reduce an electromagnetic noise caused by switching in an electric tool for carrying out a phase control or an antiphase control of an AC motor.

Means for Solving the Problems

An electric tool according to the present invention includes an AC motor to which a power is supplied from an AC power supply and constant voltage generating means for generating a constant voltage from an AC voltage, and using switching means connected in series to the AC motor to carry out a phase control or an antiphase control over the power to be supplied to the AC motor, and the switching means includes two transistors which have sources or emitters connected to each other and are disposed in anti-series, the constant voltage generating means includes a series circuit of a first resistor and a diode and a parallel circuit of a capacitor and a Zener diode, one end of the first resistor is connected to a node between the AC power supply and the AC motor, a cathode of the diode is connected to one end of the capacitor and a cathode of the Zener diode, and the other end of the capacitor and an anode of the Zener diode are connected to the sources or the emitters of the two transistors, a control terminal of one transistor of the two transistors is connected to one end of a second resistor, and a control terminal of the other transistor of the two transistors is connected to one end of a third resistor, and a voltage at the other end of the second resistor and a voltage at the other end of the third resistor are switched between a voltage at a node between the series circuit and the parallel circuit and a voltage at the sources or the emitters of the two transistors so that the two transistors are turned ON or OFF.

Moreover, the electric tool according to the present invention further includes control means for switching a voltage at the other end of the second resistor and a voltage at the other end of the third resistor between the voltage at the node between the series circuit and the parallel circuit and the voltage at the source or the emitter of at least one of the transistors, and the control means includes a photocoupler, a collector of a phototransistor of the photocoupler being connected to the node between the series circuit and the parallel circuit, and an emitter of the phototransistor is connected to the other end of the second resistor and the other end of the third resistor and is connected to the sources or the emitters of the two transistors through a resistor.

The electric tool according to the present invention includes an AC motor to which a power is supplied from an AC power supply and constant voltage generating means for generating a constant voltage from an AC voltage, and using switching means connected in series to the AC motor to carry out a phase control or an antiphase control over the power to be supplied to the AC motor, and the switching means includes a diode bridge having one input terminals connected to the AC motor and the other input terminal connected to the AC power supply, and a transistor disposed between output terminals of the diode bridge for turning ON or OFF a current between the output terminals, the constant voltage generating means includes a series circuit of a first resistor and a diode and a parallel circuit of a capacitor and a Zener diode, one end of the first resistor is connected to a node between the AC power supply and the AC motor, a cathode of the diode is connected to one end of the capacitor and a cathode of the Zener diode, and the other end of the capacitor and an anode of the Zener diode are connected to a source or an emitter of the transistor, a control terminal of the transistor is connected to one end of a second resistor, and a voltage at the other end of the second resistor is switched between a voltage at a node between the series circuit and the parallel circuit and a voltage at the source or the emitter of the transistor so that the transistor is turned ON or OFF.

Moreover, the electric tool according to the present invention further includes control means for switching a voltage at the other end of the second resistor between the voltage at the node between the series circuit and the parallel circuit and the voltage at the source or the emitter of the transistor, and the control means includes a photocoupler, a collector of a phototransistor of the photocoupler being connected to the node between the series circuit and the parallel circuit, and an emitter of the phototransistor is connected to the other end of the second resistor while being connected to the source or the emitter of the transistor through a resistor.

Effects of the Invention

In the present invention, there are provided the series circuit of the resistor and the diode and the parallel circuit of the capacitor and the Zener diode, and there is used the constant voltage generating means in which the one end of the resistor is connected to the node between the AC power supply and the AC motor. Consequently, a constant voltage is generated from an AC voltage with the cost lower, space saved, weight lighter and circuit structure simpler without using an electrical component such as a transformer, and the constant voltage is applied to the control terminal of the transistor. The constant voltage thus generated is applied to the control terminal of the transistor through the resistor connected to the control terminal of the transistor. Therefore, a change in current in switching is relieved so that an electromagnetic noise is prevented from being caused by the change in current. In the case where a commercial AC power supply is used as the AC power supply, for example, the constant voltage having a sufficient magnitude for the control of the transistor capable of controlling a large current is generated by the constant voltage generating means according to the present invention. Thus, it is possible to carry out the phase control or the antiphase control of the AC motor using the large current transistor as the switching element.

BRIEF DESCRIPTION OF THE DRAWINGS

FIG. 1 is a circuit diagram showing an electrical structure according to a first embodiment of an electric tool in accordance with the present invention.

FIG. 2 is a circuit diagram showing an electrical structure according to a second embodiment of an electric tool in accordance with the present invention.

DETAILED DESCRIPTION OF EMBODIMENTS

The present invention will be described below with reference to the drawings. FIG. 1 is a circuit diagram schematically showing an electrical structure for an electric tool according to a first embodiment of the present invention. The electric tool includes an AC motor 3 using an AC power supply 1 as a power supply, switching means 5 for turning ON or OFF an application of an AC voltage to the AC motor 3, control means 7 for controlling an operation of the switching means 5 in such a manner that a voltage is applied to the AC motor 3 at a predetermined phase angle or firing angle, and constant voltage generating means 9 for generating, from the AC voltage, a constant voltage to be used for the control of the switching means 5 and supplying the constant voltage to the control means 7.

For example, the AC power supply 1 is a commercial AC power supply for a single-phase AC, in which a 100V single-phase AC power supply of 50 Hz or 60 Hz, a 220V single-phase AC current power supply of 50 Hz or the like may be used. The electric tool according to the present invention is a bolt tightening machine, for example, and the AC motor 3 is used for rotating and driving a socket to be removably fitted in a head portion of a bolt or a nut screwed into a bolt. In this specification, there will be omitted description related to the details of an electric tool which is not concerned in the present invention.

The switching means 5 includes two N-channel MOSFETs 51, 52 which are connected in anti-series with their sources connected to each other. Between the drain and the source of the MOSFET 51 is provided a diode 61 for permitting a reversed flow of current. Similarly, between the drain and the source of the MOSFET 52 is also provided a diode 62 for permitting the reverse flow of the current. From the control means 7 to control terminals, that is, gates of the MOSFETs 51, 52 are supplied the same gate control signals as each other. When the gate control signals reach high level, that is, a gate driving voltage is applied to the MOSFETs 51, 52, both of the MOSFETs 51, 52 are turned ON. The two MOSFETs 51, 52 and the AC motor 3 are connected in series. When both of the MOSFETs 51, 52 are turned ON, a current flowing from an upper side of the AC motor 3 to a lower side thereof in FIG. 1 flows between the drain and the source of the MOSFET 51 through the diode 62. In FIG. 1, a current flowing from the lower side of the AC motor 3 to the upper side thereof flows between the drain and the source of the MOSFET 52 through the diode 61. When the MOSFETs 51, 52 are turned ON, therefore, an AC current flows through the AC motor 3 so that a power is supplied to the AC motor 3. When the gate control signals reach low level, both of the MOSFETs 51, 52 are turned OFF so that the switching means 5 (or a circuit constituted by the AC motor 3 and the switching means 5) is brought into a non-conduction state. Consequently, the power is not supplied to the AC motor 3. In the case where parasitic diodes of the MOSFETs 51, 52 can be utilized in place of the diodes 61 and 62, the diodes 61 and 62 do not need to be provided.

The control means 7 includes a zero cross detecting circuit 71, a timer circuit 73, a CPU 75, a clock 77, and a flip-flop circuit 79. Between output terminals of the zero cross detecting circuit 71 is connected a series circuit of a light emitting diode of a first photocoupler 81 and a resistor 82. A collector of a phototransistor of the first photocoupler 81 is connected to a power supply which is not shown, and an emitter of the phototransistor is connected to an input terminal of the timer circuit 73 and a reset terminal of the flip-flop circuit 79, and furthermore, is grounded through a resistor 83. Between input terminals of the zero cross detecting circuit 71 is applied an AC voltage from the AC power supply 1, and the zero cross detecting circuit 71 detects a state in which the AC voltage from the AC power supply 1 is zero, that is, a zero cross point, thereby generating a signal having a short-time pulse corresponding to the zero cross point of the AC voltage at a pulse interval which is a half cycle of the AC voltage. The pulse signal thus generated is input through the first photocoupler 81 to the timer circuit 73 and the flip-flop circuit 79.

The timer circuit 73 starts to count a time every time the timer circuit 73 receives the pulse output from the zero cross detecting circuit 71. When a predetermined set time is counted, a pulse is output to a set terminal of the flip-flop circuit 79. In other words, the timer circuit 73 delays the pulse signal output from the zero cross detecting circuit 71 by the set time and outputs the delayed pulse signal to the flip-flop circuit 79.

The clock 77 generates a clock signal to be used for counting the time by the timer circuit 73. The CPU 75 sets the set time, that is, the delay time of the pulse signal and gives the set time to the timer circuit 73. The electric tool according to the present invention is a bolt tightening machine, for example, and a user of the electric tool can optionally set a bolt tightening torque through operating means which is not shown. The CPU 75 determines the set time depending on a set value of the tightening torque set by the user, and gives the set time to the timer circuit 73.

The pulse signal output from the zero cross detecting circuit 71 is input to a reset terminal of the flip-flop circuit 79, and furthermore, is delayed by the set time and is thus input to the set terminal of the flip-flop circuit 79. The flip-flop circuit 79 in FIG. 1 is brought into a reset state by the input of the pulse to the reset terminal, and is brought into a set state by the input of the pulse to the set terminal after the passage of the set time from the input of the pulse. Consequently, the flip-flop circuit 79 generates a pulse signal having a pulse interval which is a half cycle of the alternating current and a pulse width which is a time obtained by subtracting the set time from the half cycle of the alternating current. The pulse width of each pulse in the pulse signal corresponds to a phase angle of the phase control.

The output terminal of the flip-flop circuit 79 is grounded through a light emitting diode of the second photocoupler 84 and a resistor 85. A collector of a phototransistor of the second photocoupler 84 is connected to a power line for supplying the constant voltage generated by the constant voltage generating means 9, and an emitter of the phototransistor of the second photocoupler 84 is connected through gate resistors 53, 54 to each of gates of the MOSFETs 51, 52. Moreover, the emitter of the phototransistor is connected through a resistor 86 to sources of the MOSFETs 51, 52.

In the case where the pulse signal output from the flip-flop circuit 79 is at high level, the phototransistor of the second photocoupler 84 is turned ON by light from the light emitting diode of the second photocoupler 84. Consequently, the constant voltage generated by the constant voltage generating means 9 is applied to the gates of the MOSFETs 51, 52 so that the MOSFETs 51, 52 are turned ON. In the case where the pulse signal output from the flip-flop circuit 79 is at low level, the MOSFETs 51, 52 are turned OFF. The MOSFETs 51, 52 are turned OFF depending on the zero cross point of the AC voltage. When a time corresponding to the phase angle passes after the MOSFETs 51, 52 are turned OFF, the MOSFETs 51, 52 are turned ON. By repeating this operation, the phase control of the AC motor 3 is achieved. The electric tool according to the present invention is a bolt tightening machine, for example, and the power of the AC motor 3 is regulated in such a manner that a tightening torque reaches a set value through an application of the AC voltage with a phase angle corresponding to the set value of the tightening torque set by a user to the AC motor 3.

When the pulse signal output from the flip-flop circuit 79 is at high level, the voltage to be applied to the gate resistors 53, 54 of the MOSFETs 51, 52 is the constant voltage generated by the constant voltage generating means 9, that is, a gate driving voltage. When the pulse signal reaches low level, the voltage to be applied to the gate resistors 53, 54 of the MOSFETs 51, 52 is source voltage for the MOSFETs 51, 52, that is, a reference voltage. When the phase control of the AC motor 3 is carried out, the voltage to be applied to the gate resistors 53, 54 of the MOSFETs 51, 52 is thus changed repetitively between the gate driving voltage and the reference voltage. The gate resistor 53 and a gate capacity to be a parasitic capacitance between the gate and the source of the MOSFET 51 function as an RC delay circuit so that the change in the voltage at the gate of the MOSFET 51 is relieved. Moreover, the gate resistor 54 and a gate capacity to be a parasitic capacitance between the gate and the source of the MOSFET 52 function as an RC delay circuit so that the change in the voltage at the gate of the MOSFET 52 is relieved. Consequently, changes in current flowing between the drain and the source of the MOSFETs 51, 52 are relieved so that an electromagnetic noise is prevented from being caused by the phase control of the AC motor 3.

In the present embodiment, between the gate and the source of the MOSFET 51 is connected a capacitor 63 and between the gate and the source of the MOSFET 52 is also connected a capacitor 64 in order to regulate a delay time, that is, an RC time constant. In the case where the delay time is properly given for the gate resistors 53, 54 and the gate capacities of the MOSFETs 51, 52 so that the changes in current of the MOSFETs 51, 52 can be relieved sufficiently, the capacitors 63, 64 do not need to be provided.

The constant voltage generating means 9 includes a series circuit of a resistor 91 and a diode 93 and a parallel circuit of a capacitor 95 and a Zener diode 94, and a voltage at a node between the series circuit and the parallel circuit is equivalent to the constant voltage generated by the constant voltage generating means 9. One end of the resistor 91 is connected to a node between the AC power supply 1 and the AC motor 3. A cathode of the diode 93 is connected to one end of the capacitor 95 and a cathode of the Zener diode 97, and the other end of the capacitor 95 and an anode of the Zener diode 97 are connected to the sources of the MOSFETs 51, 52.

The diode 93 of the constant voltage generating means 9 carries out a half-wave rectification of the AC voltage from the AC power supply 1 and the capacitor 95 carries out a smoothing of a rectified DC voltage. Moreover, the Zener diode 97 gives an upper limit of the smoothed DC voltage so that the node between the series circuit of the resistor 91 and the diode 93 and the parallel circuit of the capacitor 95 and the Zener diode 97 is maintained at an almost constant voltage with respect to the reference electric potential being an electric potential of the sources of the MOSFETs 51, 52. The constant voltage, that is, the gate driving voltage can be raised with respect to the reference voltage to such a degree as to drive the MOSFET having a large current (for example, +12V).

By constituting the constant voltage generating means 9 as described above, in the electric tool according to the present embodiment, the gate driving voltage to be applied to the gates of the MOSFETs 51, 52 is generated from the AC voltage with the cost lower, space saved, weight lighter and structure simpler without using an electrical component such as a transformer.

FIG. 2 is a circuit diagram schematically showing an electrical structure of an electric tool according to a second embodiment of the present invention. In the second embodiment, switching means 5 is constituted by using a single N-channel MOSFET 55 and a diode bridge 56, and between input terminals of the diode bridge 56 are connected an AC power supply 1 and an AC motor 3 in series. An output terminal on positive side of the diode bridge 56 is connected to a drain of the MOSFET 55, and an output terminal on negative side of the diode bridge 56 is connected to a source of the MOSFET 55. In the case where the MOSFET 55 is ON, a current flowing from an upper side of the AC motor 3 to a lower side thereof in FIG. 2 flows through an upper right diode 56a, the MOSFET 55 and a lower left diode 56b, and a current flowing from the lower side of the AC motor 3 to the upper side thereof flows through an upper left diode 56c, the MOSFET 55 and a lower right diode 56d. When the MOSFET 55 is turned ON, therefore, an AC current flows through the AC motor 3 so that a power is supplied to the AC motor 3. When the MOSFET 55 is turned OFF, the switching means 5 for a circuit constituted by the AC motor 3 and the switching means 5) is brought into a non-conduction state. Consequently, the power is not supplied to the AC motor 3.

The electric tool according to the second embodiment is also provided with control means 7 and constant voltage generating means 9 which are the same as those in the first embodiment. An emitter of a phototransistor of a second photocoupler 84 is connected through a gate resistor 57 to a gate of the MOSFET 55. Between the gate and the source of the MOSFET 55 is disposed a capacitor 65. Moreover, the emitter of the phototransistor of the second photocoupler 84 is connected through a resistor 86 to the source of the MOSFET 55. One end of a capacitor 95 of the constant voltage generating means 9 and an anode of a Zener diode 97 are connected to the source of the MOSFET 55. It can be understood from the above description that also in the electric tool according to the second embodiment the phase control of the AC motor 3 is carried out in the same manner as the electric tool according to the first embodiment.

Although the power of the AC motor 3 is controlled by the phase control in the first embodiment and the second embodiment, in the case where the power of the AC motor 3 is controlled by the antiphase control, it is preferable to dispose an inverter between the output terminal of the flip-flop circuit 79 and the anode of the light emitting diode of the second photocoupler 84, for example.

Although the N-channel MOSFET is used as the MOSFETs 51, 52, 55 of the switching means 5 in the first embodiment and the second embodiment, a P-channel MOSFET may be used in the switching means 5. In place of the MOSFETs 51, 52, 55, moreover, a transistor such as an IGBT or a bipolar type transistor may be used. For example, in the case where the MOSFETs 51, 52 of the first embodiment are replaced with the IGBT, the emitters are connected to each other so that two IGBTs are connected in anti-series. Collectors of the IGBTs are connected to the AC power supply 1 and the AC motor 3. In the case where the MOSFETs 51, 52 of the first embodiment are replaced with the bipolar type transistor, moreover, the emitters are connected to each other so that two bipolar type transistors are connected in anti-series. Collectors of the bipolar type transistors are connected to the AC power supply 1 and the AC motor 3, and bases of the bipolar type transistors are connected through the resistors 53, 54 to the emitter of the phototransistor of the second photocoupler 84.

The description of the embodiments is only illustrative for the present invention and the invention described in the claims should not be construed to be restrictive or the scope should not be understood to be restrictive. Moreover, the structure of each portion according to the present invention is not restricted to the embodiments but it is a matter of course that various changes can be made within the technical scope of the invention described in the claims.

DESCRIPTION OF REFERENCE CHARACTERS (1) AC power supply
(3) AC motor
(5) switching means
(7) control means
(9) constant voltage generating means
(51) MOSFET
(52) MOSFET
(53) gate resistor
(54) gate resistor
(55) MOSFET
(56) diode bridge
(57) gate resistor
(84) photocoupler
(91) resistor
(93) diode
(95) capacitor
(97) Zener diode

The invention claimed is:

1. An electric tool, comprising: an AC motor to which a power is supplied from an AC power supply; and constant voltage generating means for generating a constant voltage from an AC voltage, and using switching means connected in series to the AC motor to carry out a phase control or an antiphase control over the power to be supplied to the AC motor, wherein the switching means includes two transistors which have sources or emitters connected to each other and are disposed in anti-series, the constant voltage generating means includes a series circuit of a first resistor and a diode and a parallel circuit of a capacitor and a Zener diode, one end of the first resistor is connected to a node between the AC power supply and the AC motor, a cathode of the diode is connected to one end of the capacitor and a cathode of the Zener diode, and the other end of the capacitor and an anode of the Zener diode are connected to the sources or the emitters of the two transistors, a control terminal of one transistor of the two transistors is connected to one end of a second resistor, and a control terminal of the other transistor of the two transistors is connected to one end of a third resistor, and a voltage at the other end of the second resistor and a voltage at the other end of the third resistor are switched between a voltage at a node between the series circuit and the parallel circuit and a voltage at the sources or the emitters of the two transistors so that the two transistors are turned ON or OFF.

2. The electric tool according to claim 1, further comprising control means for switching the voltage at the other end of the second resistor and the voltage at the other end of the third resistor between the voltage at the node between the series circuit and the parallel circuit and the voltage at the source or the emitter of at least one of the transistors, the control means including a photocoupler, a collector of a phototransistor of the photocoupler being connected to the node between the series circuit and the parallel circuit, and an emitter of the phototransistor being connected to the other end of the second resistor and the other end of the third resistor while being connected to the sources or the emitters of the two transistors through a resistor.

3. An electric tool, comprising: an AC motor to which a power is supplied from an AC power supply; and constant voltage generating means for generating a constant voltage from an AC voltage, and using switching means connected in series to the AC motor to carry out a phase control or an antiphase control over the power to be supplied to the AC motor, wherein the switching means includes a diode bridge having one input terminals connected to the AC motor and the other input terminal connected to the AC power supply, and a transistor disposed between output terminals of the diode bridge for turning ON or OFF a current between the output terminals, the constant voltage generating means includes a series circuit of a first resistor and a diode and a parallel circuit of a capacitor and a Zener diode, one end of the first resistor is connected to a node between the AC power supply and the AC motor, a cathode of the diode is connected to one end of the capacitor and a cathode of the Zener diode, and the other end of the capacitor and an anode of the Zener diode are connected to a source or an emitter of the transistor, a control terminal of the transistor is connected to one end of a second resistor, and a voltage at the other end of the second resistor is switched between a voltage at a node between the series circuit and the parallel circuit and a voltage at the source or the emitter of the transistor so that the transistor is turned ON or OFF.

4. The electric tool according to claim 3, further comprising control means for switching the voltage at the other end of the second resistor between the voltage at the node between the series circuit and the parallel circuit and the voltage at the source or the emitter of the transistor, the control means including a photocoupler, a collector of a phototransistor of the photocoupler being connected to the node between the series circuit and the parallel circuit, and an emitter of the phototransistor being connected to the other end of the second resistor while being connected to the source or the emitter of the transistor through a resistor.

\* \* \* \* \*